United States Patent

Dufresne et al.

[11] Patent Number: 5,898,706
[45] Date of Patent: Apr. 27, 1999

[54] STRUCTURE AND METHOD FOR RELIABILITY STRESSING OF DIELECTRICS

[75] Inventors: Roger Aime Dufresne, Fairfax; Charles William Griffin, Underhill, both of Vt.; Chorng-Lii Hwang, Wappingers Falls, N.Y.; William Alan Klaasen, Underhill; Alvin Wayne Strong, Essex Junction, both of Vt.

[73] Assignee: International Business Machines Corporation, Armonk, N.Y.

[21] Appl. No.: 08/846,989

[22] Filed: Apr. 30, 1997

[51] Int. Cl.[6] .................................................. G01R 31/12
[52] U.S. Cl. ............................................. 371/28; 324/765
[58] Field of Search .................... 371/28, 21.4; 364/481, 364/483, 489, 490, 550, 482, 488, 579; 324/500, 522, 537, 519, 525; 365/201, 149

[56] References Cited

U.S. PATENT DOCUMENTS

| | | | |
|---|---|---|---|
| Re. 32,625 | 3/1988 | Schwarz et al. | 374/57 |
| 3,883,802 | 5/1975 | Puri | 324/73 R |
| 3,983,479 | 9/1976 | Lee et al. | 324/158 R |
| 4,730,160 | 3/1988 | Cusack et al. | 324/158 R |
| 4,739,258 | 4/1988 | Schwarz | 324/158 R |
| 4,739,388 | 4/1988 | Packeiser et al. | 357/68 |
| 5,047,711 | 9/1991 | Smith et al. | 324/158 R |
| 5,049,811 | 9/1991 | Dreyer et al. | 324/158 R |
| 5,138,427 | 8/1992 | Furuyama | 357/68 |
| 5,265,057 | 11/1993 | Furuyama et al. | 365/201 |
| 5,276,647 | 1/1994 | Matsui et al. | 365/201 |
| 5,297,087 | 3/1994 | Porter | 365/201 |
| 5,298,433 | 3/1994 | Furuyama | 437/8 |
| 5,317,532 | 5/1994 | Ochii | 365/149 |
| 5,357,193 | 10/1994 | Tanaka et al. | 324/158.1 |
| 5,392,219 | 2/1995 | Birch et al. | 364/483 |
| 5,404,099 | 4/1995 | Sahara | 324/158.1 |
| 5,406,212 | 4/1995 | Hashinaga et al. | 324/760 |
| 5,451,885 | 9/1995 | Birch et al. | 324/760 |
| 5,502,399 | 3/1996 | Imai | 324/765 |
| 5,506,450 | 4/1996 | Lee et al. | 257/767 |
| 5,532,600 | 7/1996 | Hoshino | 324/537 |
| 5,590,079 | 12/1996 | Lee et al. | 365/201 |
| 5,610,866 | 3/1997 | McClure | 365/201 |
| 5,686,843 | 11/1997 | Beilstein, Jr. et al. | 324/758 |

FOREIGN PATENT DOCUMENTS 6-097245  4/1994  Japan.

OTHER PUBLICATIONS

"Self–Contained Chip Heater," *IBM Technical Disclosure Bulletin*, vol. 14, No. 6, p. 1770, Nov. 1971.

IBM Technical Disclosure Bulletin, vol. 14, No. 6, Nov. 1971, Reilly et al, p. 1770.

*Primary Examiner*—Robert W. Beausoliel, Jr.
*Assistant Examiner*—Nadeem Iqbal
*Attorney, Agent, or Firm*—Mark F. Chadurjian

[57] ABSTRACT

The present invention is directed to an apparatus and method for reliability testing of an integrated circuit. The present invention provides a test structure and method for testing gate and node dielectrics of an integrated circuit wherein a self-heating gate structure is integrated with the product structure itself. Selected conductive lines within the product structure are used as heater elements to provide temperature stressing of the integrated circuit. The localized self-heating gate structure is an integral part of the product chip. Thus, etch and deposition characteristics of the test structure are kept identical to the etch and deposition characteristics of the product itself. As low-voltage technologies make it harder to obtain significant acceleration due to voltage stressing, temperature stressing may be used instead to increase acceleration.

20 Claims, 5 Drawing Sheets

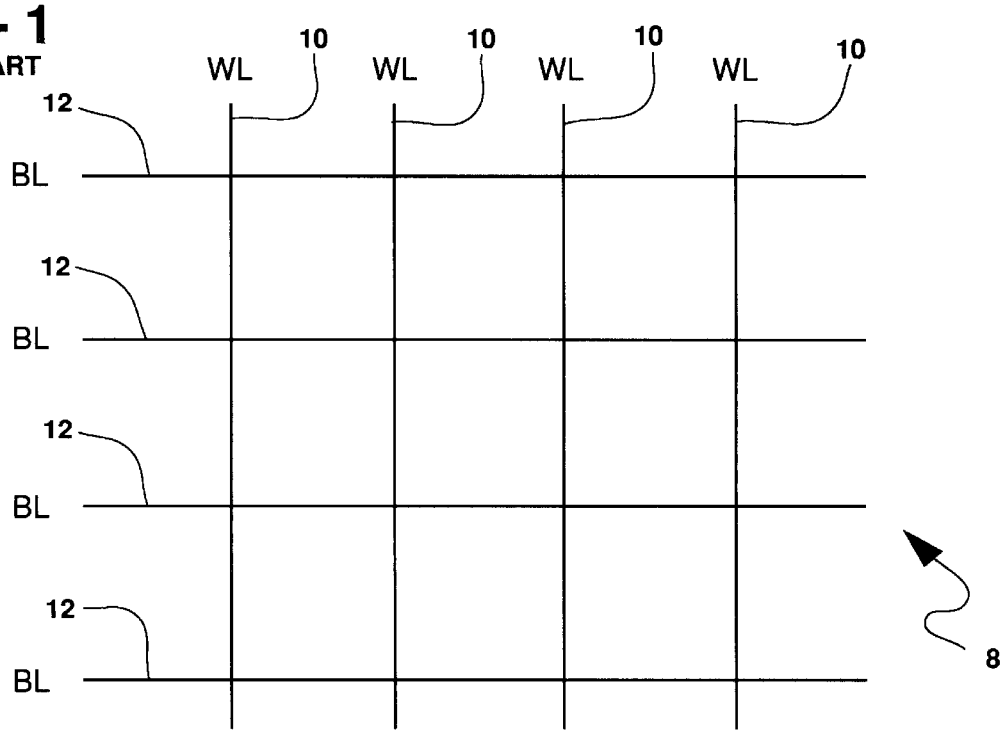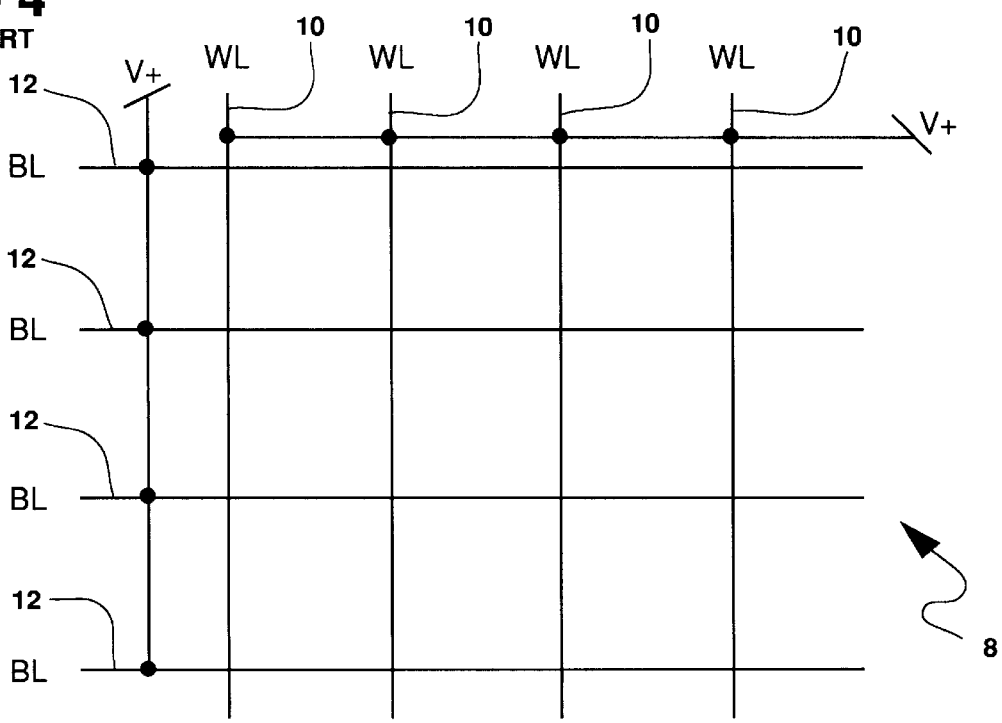

STRUCTURE AND METHOD FOR RELIABILITY STRESSING OF DIELECTRICS

TECHNICAL FIELD OF THE INVENTION

The invention relates to the field of reliability testing of integrated circuits. More particularly, the invention relates to an apparatus and method for reliability stressing of thin gate and node dielectrics for low voltage technologies.

BACKGROUND OF THE INVENTION

In the reliability engineering of integrated circuits, it is necessary to predict product lifetimes and calculate defect densities. To accomplish this in a short time, it is necessary to subject product samples to environmental conditions that accelerate the failure modes that cause wearout. Typical methods for creating these stress conditions include the use of temperature and voltage such that the stress temperature used for testing exceeds the operating temperature when the circuit is in actual use, and such that the stress voltage used for testing exceeds the operating voltage when the circuit is in actual use.

Voltage acceleration has been used as the primary factor for gate and node dielectric stressing throughout CMOS history. An example of voltage stressing of a memory array is described below with reference to FIGS. 1 through 6.

FIG. 1 illustrates a typical memory array 8 with intersecting word lines 10 and bit lines 12. Referring now to FIG. 2, a three-dimensional plan view of the typical memory array 8 of FIG. 1, in this case a DRAM, is illustrated. Typical DRAMs are known in the art, thus only briefly discussed herein. The DRAM 8 includes intersecting word lines 10 and bit lines 12. Each bit line 12 is connected to a diffusion 14 by way of a via, or contact 16. This connection is shown in greater detail in the enlarged portion of memory array 8, shown in FIG. 3. For simplicity, dielectric material 15 has been omitted except as shown in the enlarged portion of FIG. 3. The DRAM 8 shown uses trench capacitors 18 as the storage elements. However, stack capacitors are also widely used.

Voltage stressing for integrated circuits is known in the art. FIG. 4 depicts a known testing method where all the word lines 10 and bit lines 12 of a test structure are connected together to allow for voltage stressing of all of the gate or node dielectric structures of memory array 8 at the same time. (It is assumed that the substrate is grounded). The portion of the gate dielectric stressed during reliability testing is shown by the dashed line 17 in the enlarged portion of FIG. 3. The node dielectric, i.e., the dielectric (not shown) separating node 18 from the surrounding silicon, is also stressed.

During a voltage stressing of a gate dielectric or of a node 18, a desired word line 10 is activated (i.e. a voltage potential is applied to the word line 10) for turning on an associated field effect transistor (FET) 31 (shown in FIG. 5). As shown in FIG. 5, the associated bit line 20 is thus connected, through connection 30, with a corresponding storage node 18. As discussed below, the voltage potential applied to the bit line is at most twice the use voltage, Vuse. Voltage stressing in this manner stresses both the gate dielectric 17 and the node dielectric (not shown) associated with node 18, or, if no bias is applied to bit line 20, just gate dielectric 17 is stressed. The gate dielectric 17 is also shown (by a dashed line) in FIG. 6, which depicts a side view of FET 31. Of course, either nFETs or pFETs can be used as the array transfer devices.

As operating voltages decrease and the gate dielectrics and junctions get thinner, however, significant voltage acceleration has become more difficult to achieve. One frequently used voltage acceleration model expresses the voltage acceleration by the formula $Vacc = e^{\beta(Vstress - Vuse)}$. In this formula, $\beta$ is constant. The acceleration thus is dependent on the voltage difference. However, the junctions/circuits typically can only tolerate a stress voltage, Vstress, of at most twice the use voltage, Vuse. For a 5 volt technology the stress-to-use difference is 10 volts minus 5 volts, resulting in 5 volts, but for a 2.5 volt technology the stress-to-use difference is only 5 volts minus 2.5 volts, resulting in 2.5 volts. Since this difference (Vstress−Vuse)is then raised to a power, the maximum resultant voltage acceleration is significantly reduced. As integrated circuit dimensions continue to decrease, and become ever smaller, this decreasing voltage trend will continue. A use voltage of 1.8 V is already on the horizon. Hence this limitation on voltage acceleration is a very significant new constraint.

During the stressing of gate or node dielectrics, the temperatures normally are limited to 200° C. Wafer probing at higher wafer temperatures typically results in the probes moving slightly and causing damage to the chip. Module stressing can utilize somewhat higher temperatures, but also is limited because of the melting point of the normal chip mount metallurgies. Although special actions can be taken for short term wafer stressing up to 300° C., and special actions can permit module stressing up to at least 300° C., these activities require more expensive equipment and additional experimental time and precautions.

The normal use temperature of a chip is often at least 100° C. If that chip is stressed at 200° C., little temperature acceleration can be achieved. The typical model used for temperature stressing is an Arhennius model of the form $Tacc = e^{\Delta H/k\Delta T}$ where $\Delta T = (Tuse - Tstress)$ Kelvin, k is Boltzman's constant and $\Delta H$ is a constant.

If stressing could be done at higher temperatures, the acceleration would be larger, depending on the value of $\Delta H$ which typically is between 0.3 and 0.7. This could provide the necessary acceleration to establish the gate and node dielectric reliability for the next several generations.

Given the above-described constraints on voltage differentials and temperature differentials, the problem is how to simply achieve a reasonable acceleration when doing reliability stressing of thin gate and node dielectrics for low voltage technologies.

SUMMARY OF THE INVENTION

Accordingly, the present invention is directed to an apparatus and method for reliability testing of an integrated circuit. The present invention provides a test structure and method for testing gate and node dielectrics of an integrated circuit wherein a self-heating gate structure is integrated with the product structure itself. Selected conductive lines within the product structure are used as heater elements to provide temperature stressing of the integrated circuit. By localizing the heating to the structure under test, higher temperatures can be achieved without the problems associated with prior art methods, such as heating entire wafers or modules.

An advantage of the present invention is that the localized self-heating gate structure is an integral part of the product chip. Thus, etch and deposition characteristics of the test structure are kept identical to the etch and deposition characteristics of the product itself.

Another advantage of the present invention is that much higher temperatures may be reached than those available using prior art methods. Thus, as low-voltage technologies make it harder to obtain significant acceleration due to voltage stressing, temperature stressing may be used instead to increase acceleration.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which:

FIG. 1 is a high-level depiction of a standard memory array;

FIG. 4 is a high-level depiction of a standard memory array where all word lines and all bit lines are connected together to allow for voltage stressing of all gate and node dielectric structures at the same time;

DETAILED DESCRIPTION OF A PREFERRED EMBODIMENT OF THE INVENTION

Figure 2:
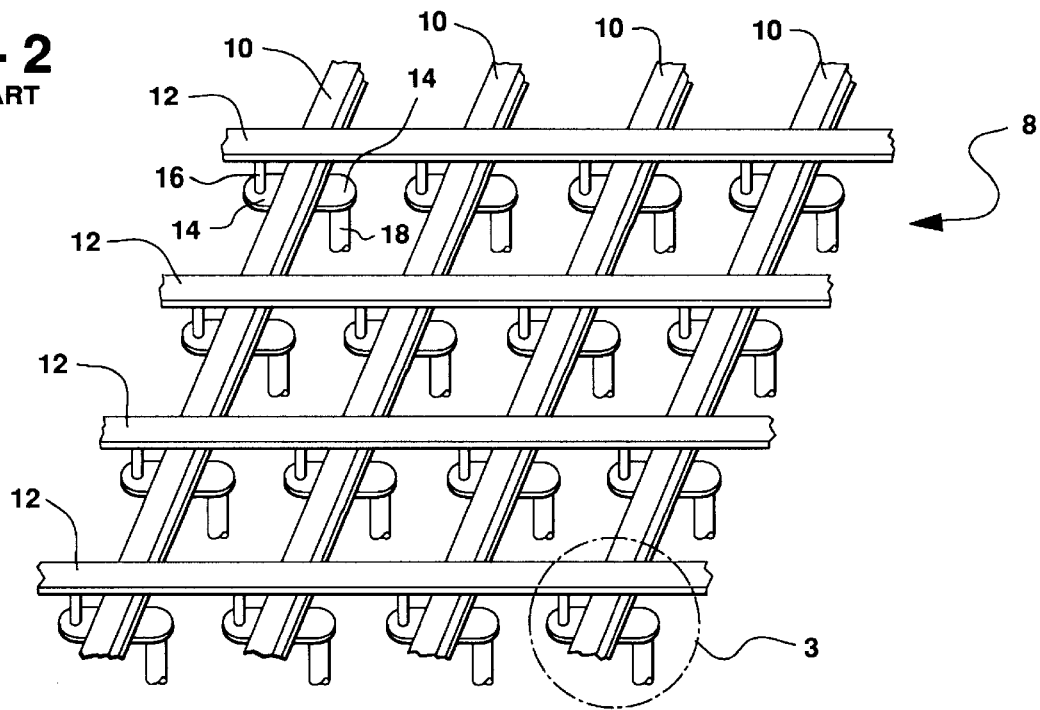
FIG. 2 is 3-dimensional plan view of the memory array of FIG. 1.
Figure 3:
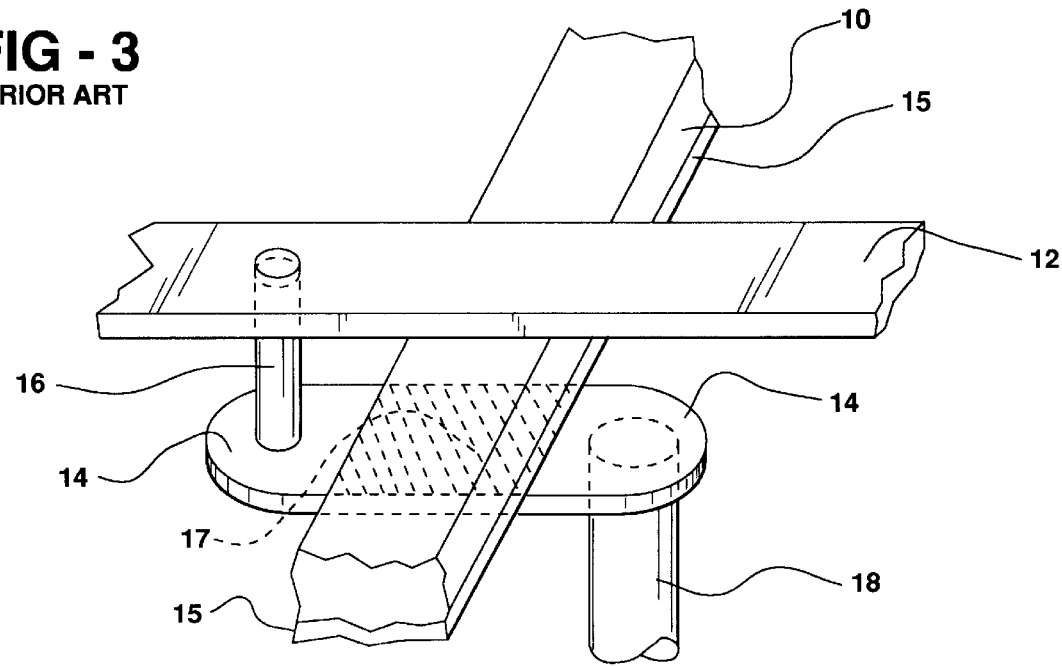
FIG. 3 is an enlarged view of a portion of FIG. 2.

The present invention provides a test structure and method for testing an integrated circuit having a self-heating gate structure integrated with a product structure itself. The self-heating gate structure and the product structure are integrated in such a manner on the integrated circuit that a test site, (i.e. the self-heating gate structure) occupies some of a product area (i.e. a portion of the product area) and the product itself occupies the remainder of the product area. This integrated structure maintains an advantage of a localized self-heating gate structure and has a further advantage of directly duplicating a tool loading for the etch and deposition steps during a manufacture of the integrated circuit. As wafer diameters increase, it becomes more important to duplicate this tool loading factor as closely as possible to ensure that the depositions and etches during the manufacturing process of the integrated circuit behave the same way on the product as they do on the test structure. It is very important that the processing steps be "tuned" for the product and not for a test site since the integrated circuit is intended for actual use as a product. In other words, the test site is modified to fit within the processing steps, and within the layout and structure of the product.

While the solution of using the product structure itself will be detailed for a DRAM, note however, that the method and structure of the present invention may be practiced on all varieties of DRAMs, SRAMs, and NVRAMs. In addition, the invention may also be applicable to all types of chips which use a common gate or word line configuration.

For the case of a DRAM, the structure and method of the present invention can be used to provide a localized self-heating node structure for either a trench storage technology or a stack storage technology. For illustrative purposes, the invention will be described with reference to a trench storage technology.

In accordance with the present invention for a DRAM, it is noted that tungsten is typically available as a low interconnect level metallization and is further used for the bit lines. The self-heating gate structure in accordance with the present invention for the case of a DRAM with a tungsten bit line is implemented as follows. Selected bit lines are connected such that a certain number of bit lines are used as heater elements for a localized, self-heating gate/node structure and the remainder are used as normal bit lines. If it is determined that half of the bit lines are needed as heater elements, the coupling scheme can be set up such that every other bit line is used as a heater element and the alternate every other bit line is used as a normal bit line. Alternately, every other pair of bit lines (i.e. every two bit lines) can be used as heaters and the intermediate pair of (i.e. the next two) bit lines used as normal bit lines. If it is determined that one quarter of the bit lines are needed as heater elements, then the bit lines can be connected such that every fourth bit line is used as a heater element, and the remainder are used as normal bit lines, and so on.

Figure 7:
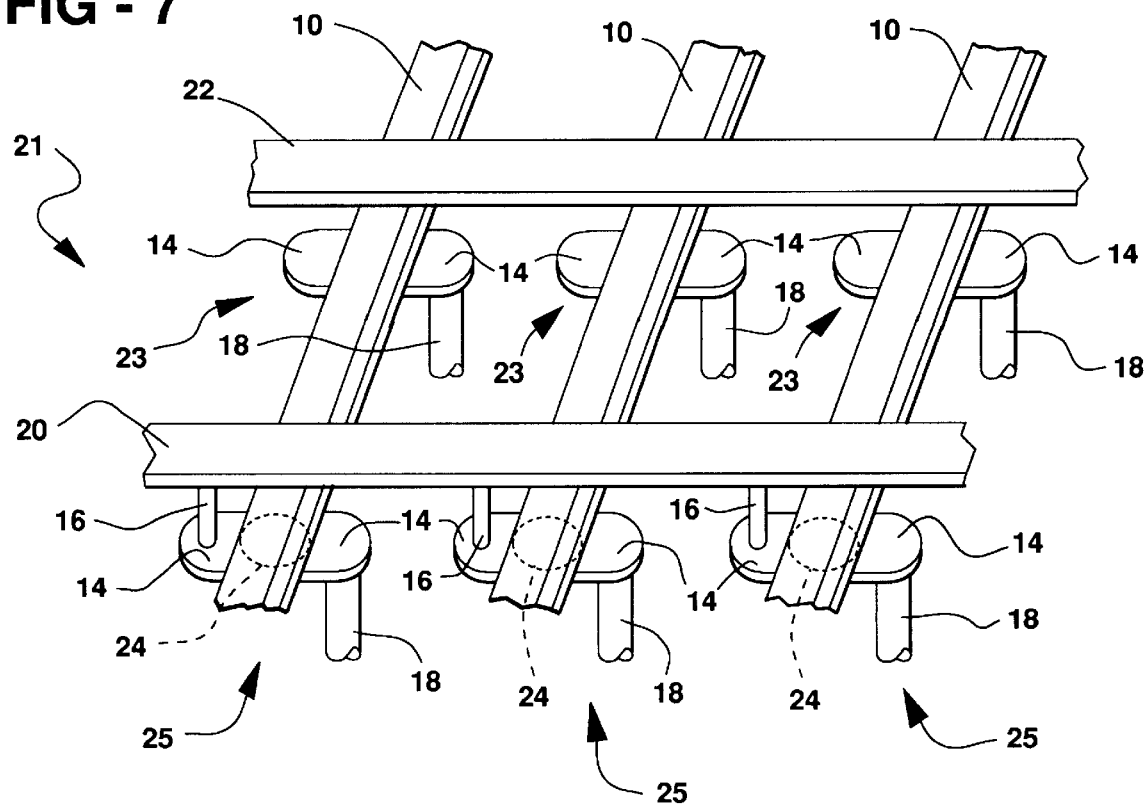
FIG. 7 is a three-dimensional plan view of several gates in a memory array, including a bit line used as a self-heating element in accordance with the present invention.

FIG. 7 depicts a memory array 21 (in this case a DRAM) in accordance with one embodiment of the present invention, wherein half the bit lines are coupled for use as heaters. Three word lines 10 are shown, along with two bit lines 20 and 22. Bit line 20 is used as a normal bit line, whereas bit line 22 is used as a heater element. A via 16 connects bit line 20 to a diffusion area 14 at each point along bit line 20 where a storage node 18 is present. The storage nodes 18 are depicted as trenches, however, a stack storage node technology is also possible.

Still referring to FIG. 7, note that there are no vias connected to heater bit line 22. Thus the respective memory cells 23 under heater bit line 22 are unused. That is, the memory cells 23 are not used for their initial intended purpose as storage nodes of a memory array, thus "unused." In addition, bit line 22 is not used as normal bit line. Instead heater bit line 22 is used to heat, and therefore thermally stress, the gate dielectric 24 and node dielectric (the dielectric material, not shown, surrounding nodes 18) associated with a neighboring bit line 20.

In accordance with the present invention, an interconnect level metallization is chosen such that a resistance of the heater elements is optimized for a desired heat generation without incurring any appreciable electro-migration problems. In the example case of tungsten, bit lines 22 are connected in such a way as to simplify the voltage-current relationship required for the desired heat generation. The normal bit lines 20 are then connected together so that a voltage (typically one-and-a-half to two times the use voltage, Vuse) may be applied to stress the dielectric under those otherwise "normal" bit lines. High-temperature stressing at 400° C. and at use voltage results in an acceleration 8 to 100 times larger than stressing at only 200° C. (twice the normal use temperature, Tuse, of a chip), depending on the value of ΔH, which is typically between 0.3 and 0.7.

Figure 5:
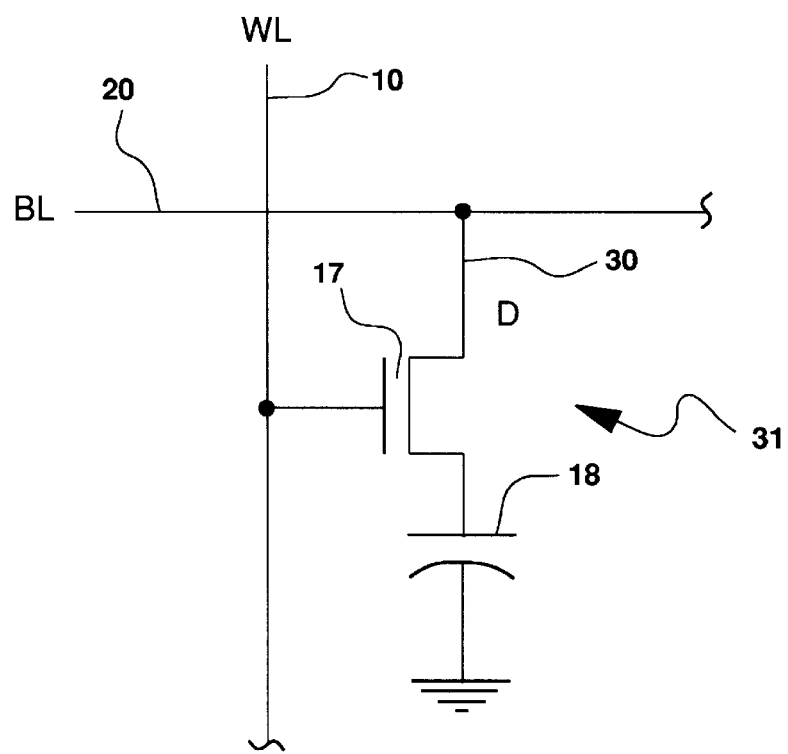
FIG. 5 is a circuit diagram of a memory cell in a memory array, configured as a typical memory cell.
Figure 6:
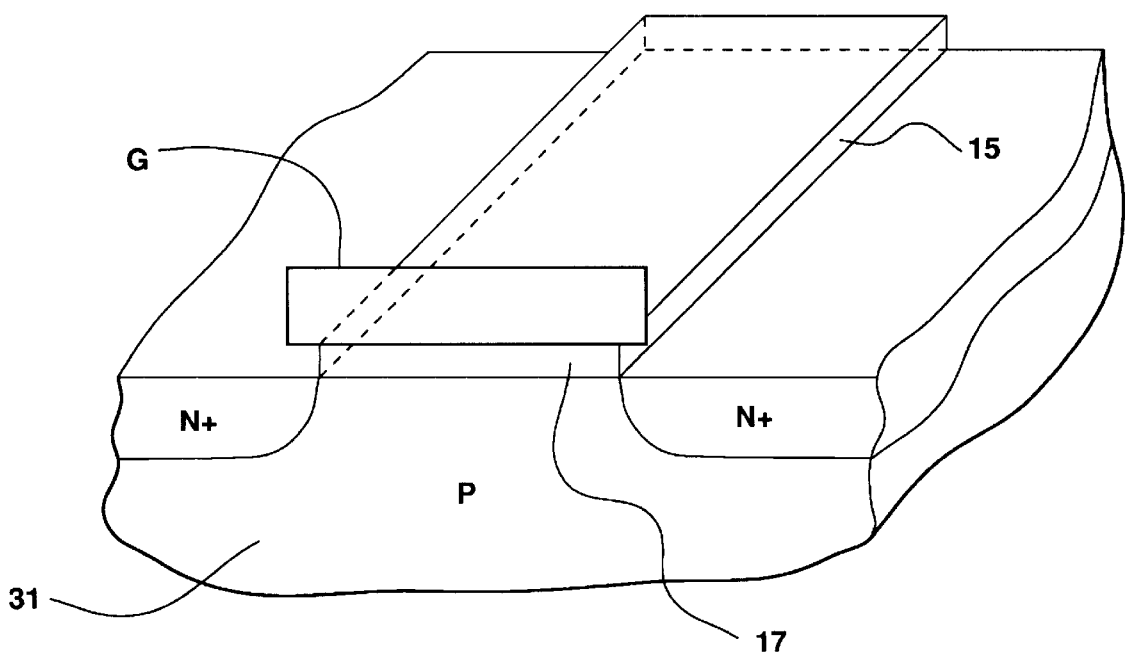
FIG. 6 is a side view of the transistor portion of the memory cell depicted in FIG. 5.
Figure 8:
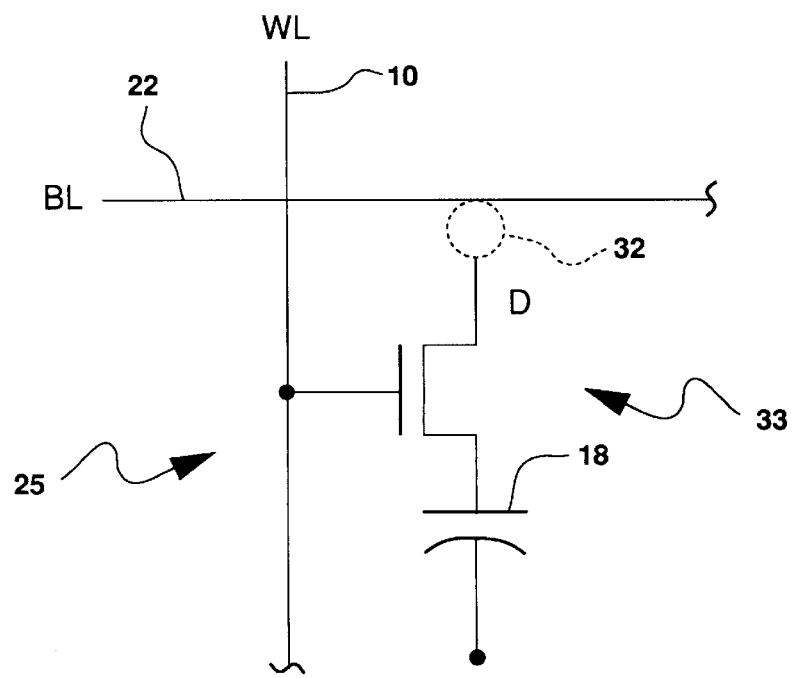
FIG. 8 is a circuit diagram of a memory cell in the memory array of FIG. 7, configured as an unused memory cell.

Turning now to FIG. 8, the difference between memory cells 25 associated with bit line 20 and memory cells 23 associated with heater bit line 22 will be described. In a memory cell 25 (shown in FIG. 7) associated with bit line 20, there is a connection 16 between the bit line 20 and the cell 25, further as depicted, for example, by the connection 30 of the memory cell of FIG. 5. As shown in FIG. 8, this connection is missing in the memory cells associated with heater bit line 22, as depicted by reference numeral 32. In other words terminal D of FET 33 is not connected to bit line 22. As indicated above with reference to FIG. 7, these cells 23 are therefore referred to as unused memory cells.

Figure 9:
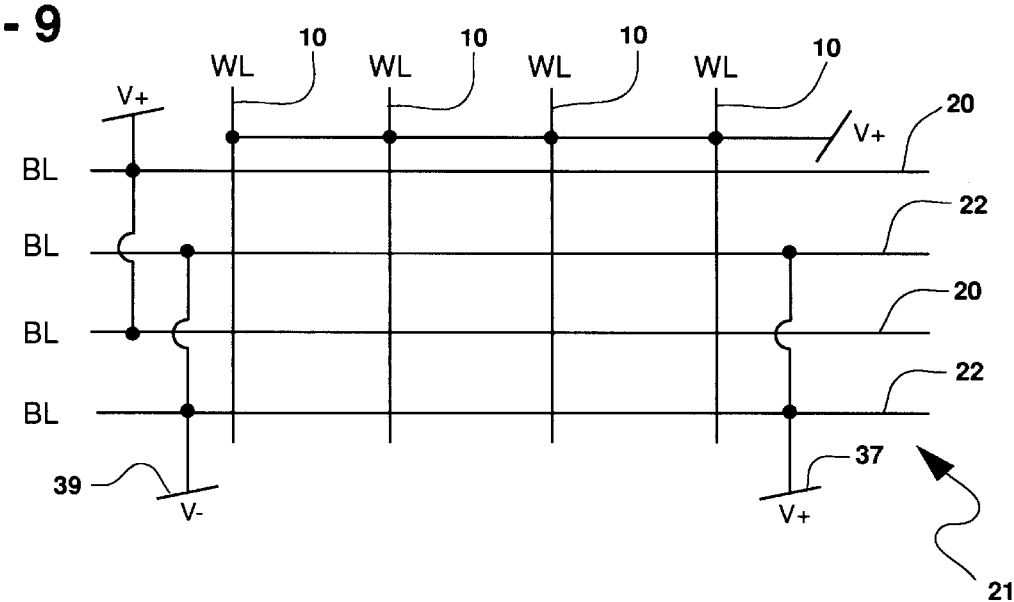
FIG. 9 is a depiction of a self-heating gate structure in accordance with one embodiment of the present invention, including every other bit line of a memory array coupled for use as a heater.
Figure 10:
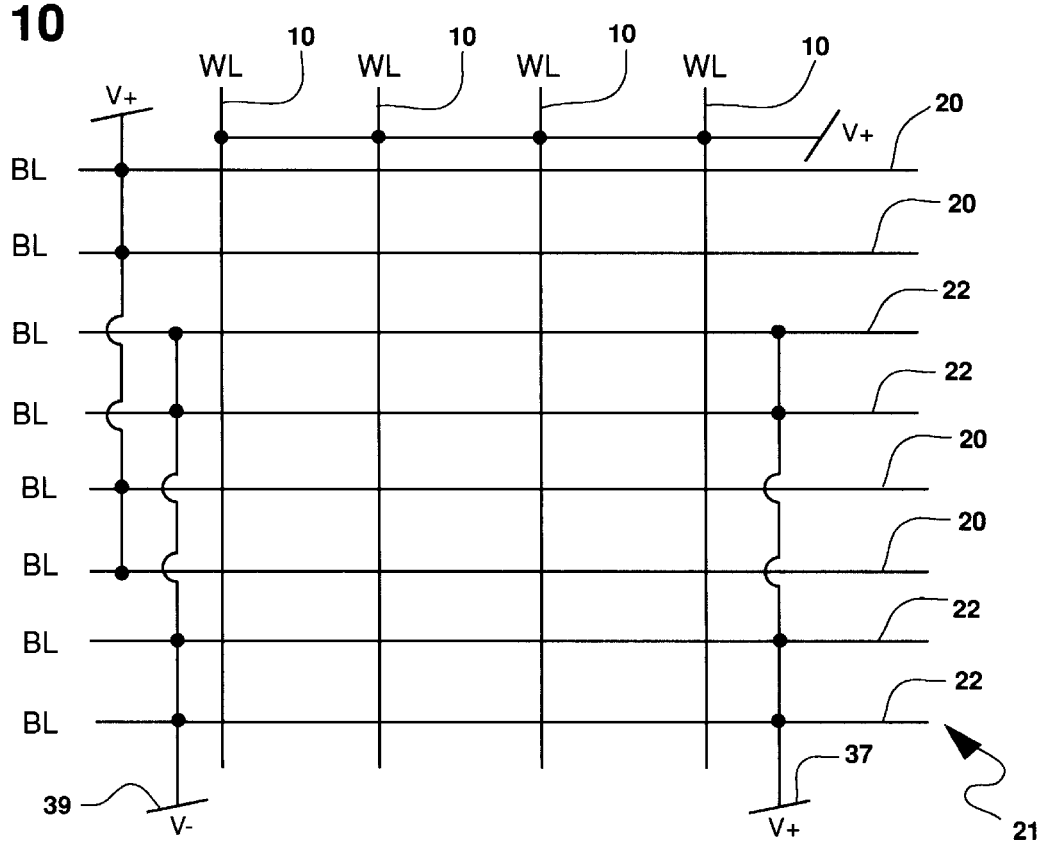
FIG. 10 is a depiction of a self-heating gate structure in accordance with another embodiment of the present invention, including every other pair of bit lines of a memory array coupled for use as heaters.

Referring now to FIGS. 9 and 10, the method used to connect the bit lines in accordance with the present invention will now be described. Although not shown in FIGS. 9 and 10, it is assumed that the substrate in each figure is grounded. It is also important to note that each voltage source depicted in the figures may be a separate voltage source.

FIG. 9 depicts a memory array 21 with a self-heating test structure in accordance with the present invention. Every other bit line 22 is connected for use as a heater. Note that this is accomplished by connecting one end of each heater bit line 22 to V+, as indicated by reference numeral 37, and the other end of each heater bit line 22 to V−, as indicated by reference numeral 39.

In accordance with another embodiment of the present invention, the number and location of bit lines chosen for use as heaters may vary. For example, referring now to the memory array 35 of FIG. 10, every other pair of bit lines are connected for use as heaters. Depending on a desired time duration of the voltage stressing and a desired heat generation, the number of bit lines chosen for use as heaters may vary.

Additionally, heater elements may be formed in any conductor which can be designed so as to sustain the currents necessary for heating, further for a period of time long enough for stress completion (i.e. until completion of a desired stressing operation).

The temperature of an array 21 or 35 (FIGS. 9 and 10) may be monitored using a temperature coefficient of resistance based upon four-point probe lines (not shown) in close proximity to the respective array. It is most beneficial if the four-point probe lines include diffusion lines as well as all of the metal levels. In addition to or instead of using probe lines, the temperature may also be monitored using diodes whose forward current has been calibrated to a desired temperature. For a DRAM, these diodes are made available in the support circuitry on the chip because some of that circuitry would not otherwise normally be used in a structure modified to stress a gate dielectric.

The localized self-heating gate structure of the present invention is an improvement over the prior art. It is simpler and less expensive to raise the temperature at the gate and node dielectrics using a heating element and structure in accordance with the present invention. In contrast, using a wafer prober with a temperature chuck or using a temperature oven for module stress (i.e. stressing all of the chips mounted on a module placed in an oven) is difficult, time-consuming, and does not allow high stress temperatures, Tstress, such as 400° C. or higher. A key part of the present invention is that the heating is localized to the structure under test. This allows a higher temperature to be achieved locally in a desired location without the problems associated with heating an entire wafer or module. In addition, significantly higher temperatures can be achieved by using a heating element on the chip which is close to (i.e. proximate) the structure under test.

The method and structure of the present invention is also superior over prior art structures in that the localized self-heating gate structure is an integral part of a product chip. Thus, the etch and deposition characteristics of the test structure are kept identical to the etch and deposition characteristics of the product itself. Therefore, the correlation between the results of the reliability tests and the product failure rate due to normal use are significantly improved.

Although the invention has been described with a certain degree of particularity, it should be recognized that elements thereof may be altered by persons skilled in the art without departing from the spirit and scope of the invention. While the method and structure of the present invention was described above with reference to a DRAM, the present invention can be practiced on all varieties of DRAMs, SRAMs, and NVRAMs. In addition, the invention is also applicable to all types of chips which use a common gate or word line configuration. The invention is limited only by the following claims and their equivalents.

What is claimed is:

1. An integrated circuit comprising:
   an array of cells comprising a first plurality of used cells and a second plurality of unused cells substantially similar to said used cells and adjacent said used cells;
   a plurality of metallic conductive lines arranged as columns;
   a plurality of metallic conductive lines arranged as rows crossing said columns, wherein a first set of rows overlie and are connected to respective ones of said used cells and a second set of rows overlie and are not connected to respective ones of said unused cells; and
   means for driving prescribed current through the second set of rows for temperature stressing a dielectric layer associated with respective ones of said used cells of the first set of rows.

2. An integrated circuit according to claim 1 wherein said array of cells comprises an array of memory cells.

3. An integrated circuit according to claim 1 wherein said array of cells comprises an array of capacitors.

4. An integrated circuit according to claim 3, wherein said capacitors are trench capacitors.

5. An integrated circuit according to claim 3, wherein said capacitors are stack capacitors.

6. An integrated circuit according to claim 1, wherein said plurality of conductive lines arranged as columns comprises a plurality of word lines.

7. An integrated circuit according to claim 1, wherein said plurality of conductive lines arranged as rows comprises a plurality of bit lines.

8. An integrated circuit according to claim 1, wherein said means for driving a prescribed current through the second set of rows comprises a voltage source connected across opposite ends of each row of the second set of rows.

9. An integrated circuit according to claim 1, wherein the dielectric layer associated with respective cells of the first set of rows comprises a gate dielectric.

10. An integrated circuit according to claim 1, wherein the dielectric layer associated with respective cells of the first set of rows comprises a node dielectric.

11. A method for testing an integrated circuit comprised of an array of cells comprising a first plurality of used cells and a second plurality of unused cells substantially similar to said used cells and adjacent said used cells, a plurality of metallic conductive lines arranged as columns, and a plurality of metallic conductive lines arranged as rows crossing said columns and overlaying said array of cells, said method comprising the steps of:

connecting a first set of rows to respective ones of said first plurality of used cells, leaving a second set of rows not connected to respective ones of said second plurality of unused cells; and driving prescribed current through the second set of rows for temperature stressing a dielectric layer associated with respective ones of said first plurality of used cells of the first set of rows.

12. A method for testing an integrated circuit according to claim 11 wherein said array of cells comprises an array of memory cells.

13. A method for testing an integrated circuit according to claim 11 wherein said array of cells comprises an array of capacitors.

14. A method for testing an integrated circuit according to claim 13, wherein said capacitors are trench capacitors.

15. A method for testing an integrated circuit according to claim 13, wherein said capacitors are stack capacitors.

16. A method for testing an integrated circuit according to claim 11, wherein said plurality of conductive lines arranged as columns comprises a plurality of word lines.

17. A method for testing an integrated circuit according to claim 11, wherein said plurality of conductive lines arranged as rows comprises a plurality of bit lines.

18. A method for testing an integrated circuit according to claim 11, wherein said driving step comprises the step of connecting a voltage source across opposite ends of each row of the second set of rows.

19. A method for testing an integrated circuit according to claim 11, wherein the dielectric layer associated with respective cells of the first set of rows comprises a gate dielectric.

20. A method for testing an integrated circuit according to claim 11, wherein the dielectric layer associated with respective cells of the first set of rows comprises a node dielectric.

* * * * *